Figure 1:
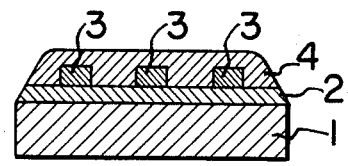

United States Patent [19]
Kojima et al.

[11] 3,981,761
[45] Sept. 21, 1976

[54] PROCESS FOR MANUFACTURING PRINTED SUBSTRATES AND DECALCOMANIA COMPOSITIONS USED THEREFOR

[75] Inventors: Yasuhiro Kojima, Inazawa; Niiti Matunaga, Yokkaichi; Motoki Nawa, Toyoake, all of Japan

[73] Assignee: Nippon Toki Kabushiki Kaisha, Nagoya, Japan

[22] Filed: Aug. 27, 1973

[21] Appl. No.: 392,001

[30] Foreign Application Priority Data
Sept. 11, 1972 Japan............................ 47-91119

[52] U.S. Cl............................. 156/235; 156/249; 156/289; 428/901; 428/914
[51] Int. Cl.².......................................... B32B 7/04
[58] Field of Search............ 156/230, 233, 239, 240, 156/247, 249, 288, 235; 161/406, 413, DIG. 7; 117/3.6, 3.3, 76 P, 3.4, 212; 29/423; 428/914, 901; 427/146, 147, 151, 152

[56] References Cited
UNITED STATES PATENTS

| | | | |
|---|---|---|---|
| 3,432,376 | 3/1969 | Reed et al. | 428/914 |
| 3,489,705 | 1/1970 | Zmitrovis et al. | 117/6 |
| 3,788,941 | 1/1974 | Kupits | 156/247 |

Primary Examiner—Douglas J. Drummond
Assistant Examiner—Michael W. Ball
Attorney, Agent, or Firm—Frank J. Jordan

[57] ABSTRACT

A process for the manufacture of printed substrates and decalcomania compositions used therefor comprising a permeable backing paper, water-soluble binder, printed pattern such as hybrid or monolithic circuit, and removable cover coat, these components being laminated one upon another.

8 Claims, 7 Drawing Figures

PROCESS FOR MANUFACTURING PRINTED SUBSTRATES AND DECALCOMANIA COMPOSITIONS USED THEREFOR

This invention relates to a process for the manufacture of a printed substrate and to a decalcomania composition for use in manufacturing the same.

Conventional printed substrates have heretofore been manufactured usually by "thick film method". The thick film method is classified into a direct printed process using a screen process printing and a hand painting process; the former being advantageous in its usefulness in the mass production of considerably precision printed substrates but being disadvantageous in its inapplicability to non-flat substrates despite its applicability to flat substrates, while the latter being applicable to non-flat substrates but being disadvantageous in its unreliable accuracy, requirement of high-grade skill, non-usability in the mass production of printed substrates, and the like.

The primary object of this invention is to provide a process for mass-producing, without special skill needed, such highly precision printed substrates as those obtained using the direct printing process.

According to the transferring process or decalcomania of this invention, a printed design or pattern layer may be transferred to a substrate on any sides including flat and non-flat surface portions. Thus, if desired, a printed electrical circuit may be transferred even to curved surfaces, including corner surfaces, to which the direct printing process does not apply. Multi-layer electric circuits have heretofore been formed on a substrate by forming a printed circuit pattern in multi-layer on the substrate in such a manner that layers for the multi-layers are fired one after another using the direct printing process, while such circuits according to this invention can be produced by one-time firing, thereby needing few treating steps for the production thereof as compared with the conventional direct printing process, eliminating the effect on the resisting material in the circuits to be produced and ensuring the production of reliable products.

When a through-hole substrate is subjected to direct printing with a pasty ink, the pasty ink will flow through the holes of the substrate and attach to the reverse side thereof thereby dirtying the substrate. In addition, if the direct printing process is used to make a printing in, for example, two layers on a substrate, the under side of a stencil for printing the second layer will be dirtied with the pasty ink of the first layer when said stencil is placed on the first layer, since the pasty ink composing the first layer is not sufficiently dried in a feasibly short time. Thus, such dirtied substrate and printing are always necessary to wash with the result of a great loss of the pasty ink containing a powdered precious metal. On the other hand, in the decalcomania, such defects as above are eliminated since printing is done on a paper support. The use of a technique of making printing on the paper support allows many paper supports to be printed at a time thereby facilitating a large-lot production of printed paper supports, provides excellent reproducibility and enables the printing to be preserved in the form of a decalcomania so that the decalcomania may be used for transferring the printing or design whenever necessary.

In the practice of this invention there is used a kind of decalcomania called "simplex decalcomania" which has long been used in transferring a printed design or pattern to ceramic ware.

The conventional simplex decalcomania comprises the steps of:

providing a decalcomania composition, prepared by coating a permeable backing paper with a water-soluble paste such as dextrin, printing a pattern on the thus-coated paper and covering the pattern-printed paper with a synthetic resin film called "cover coat", immersing the decalcomania composition in water or warmed water to dissolve the paste therein thereby separating from the paper the cover coat with the pattern attached to the under side thereof, transferring the pattern-attached cover coat to the surface of a ceramic body (this transferring method being hereinafter referred to as "slide-off method") and baking the cover coat-attached ceramic body in an electric oven or the like.

It has been found, however, that said known simplex decalcomania is not applicable to the manufacture of printed substrates without its modification. More particularly, when the known simplex decalcomania is applied as it is, to the manufacture of a printed circuit-transferred substrate, the transferred printed circuit will be frizzled at the time of baking thereby obtaining an unsatisfactory printed substrate, however precise the decalcomania or printed circuit may be.

In addition, if this conventional method (simplex decalcomania) is used in transferring a conductor material to a substrate the material will not securely be attached thereto. Said method is further disadvantageous in that the carbonization and burning away of the cover coat at the time of baking will have an undesirable effect on the resistance of the circuit of a printed substrate to be obtained thereby failing to provide this circuit with fully satisfactory properties.

This invention is characterized by, and differentiated from said simplex decalcomania in, the fact that there is used as the cover coat of a decalcomania composition a removable one which is capable of being peeled from the pattern after completion of the slide-off operation, whereby firing or baking can be effected in the absence of the cover coat.

An object of this invention is to provide a process for the easy manufacture of printed substrates with high accuracy.

Another object of this invention invention is to provide printed substrates wherein the fired, printed pattern is not frizzly but highly accurate in configuration.

Figure 3:
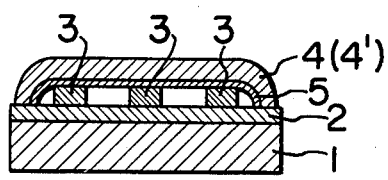
Figure 4:
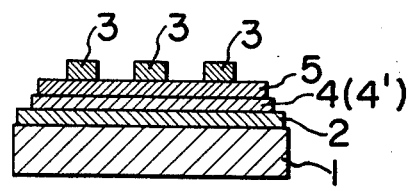
Figure 5:
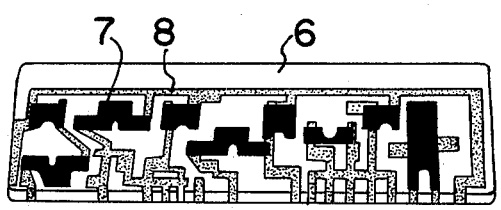
Figure 6:
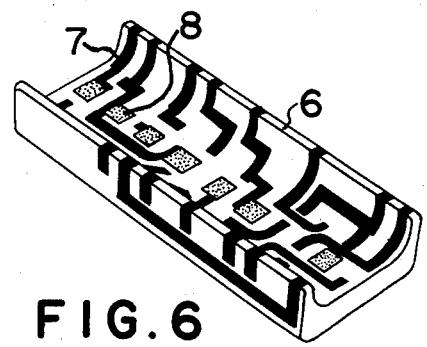
Figure 7:
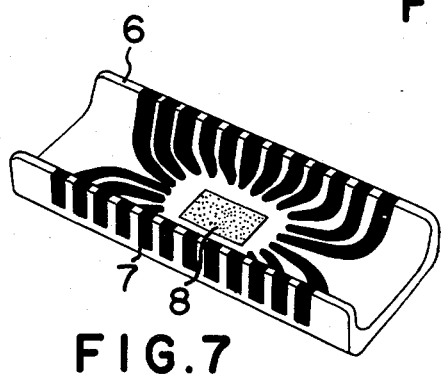

The foregoing description and other objects, features and advantages of this invention will be better understood from the following description in conjunction with the accompanying drawings, in which:

FIGS. 1 to 4 are each a diagrammatic sectional view of an embodiment of the decalcomania composition of this invention, FIG. 5 is a diagrammatic perspective view of a fired, printed circuit pattern integrally formed on the flat obverse and corner surface of an embodiment of printed substrate of this invention, FIGS. 6 and 7 are each a diagrammatic perspective view of a fired, printed circuit pattern integrally formed on the curved obverse, corner surface and reverse of another embodiment of printed substrate of this invention.

With reference to FIGS. 1 to 4, decalcomania compositions which may be used will be illustrated hereinbelow.

1. A decalcomania composition as shown in FIG. 1, which comprises a permeable backing paper 1, a water-soluble binder 2 coated in the form of a layer on the paper 1, a pattern 3 such as an electric circuit, printed on the binder layer 2, and a cover coat 4 formed on the printed pattern 3 and made of silicone rubber or a removable cover coat 4 containing a suitable amount of at least one member selected from silicone rubber and releasable surfactants.

Figure 2:
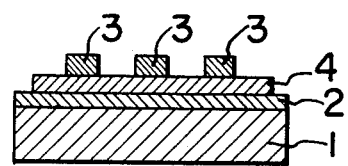

2. A decalcomania composition as shown in FIG. 2, which comprises a permeable backing paper 1, a water-soluble binder 2 coated in the form of a layer on the paper 1, a removable cover coat 4 containing a suitable amount of at least one member selected from silicone rubber and releasable surfactants and being mounted on the binder layer 2, and a pattern 3 such as an electric circuit, printed on the cover coat 4.

3. A decalcomania composition as indicated in FIG. 3, which comprises a permeable backing paper 1, a water-soluble binder 2 coated in the form of a layer on the paper 1, a pattern 3 such as an electric circuit, printed on the binder layer 2, a thin layer 5 containing at least one member selected from silicone rubber, releasable surfactants and waxes, the layer 5 being formed on the printed pattern 3, and a removable cover coat 4 or non-removable cover coat 4' formed on the layer 5.

4. A decalcomania composition as shown in FIG. 4, which comprises a permeable backing paper 1, a water-soluble binder 2 formed in the layer form on the paper 1, a removable cover coat 4 or non-removable cover coat 4' formed on the binder 2, a thin layer 5 containing at least one member selected from silicone rubber, releasable surfactants and waxes, the layer 5 being formed on the cover coat 4 or 4', and a pattern 3 such as an electric circuit, printed on the layer 5.

The terms "waxes" and "releasable surfactants" used herein are intended throughout the specification to mean "hydrocarbon-derived waxes" and "oil-soluble surfactants (polyamine salts having about 8 carbon atoms) which will, in solution, form at least two their molecules into a new single molecule and allow the thus-obtained new single molecules to be present in the micell form in the solution," respectively.

In addition, the silicone rubber- and/or releasable surfactant-containing cover coat used herein is intended to mean a plastic film or film-forming coating material containing at least one of said releasing agents. The releasing agent may preferably be contained in amounts of from 0.5 to 15% by weight.

A coating material for the cover coat should preferably contain, by weight, 15–40 parts of a film-forming resin, 10–20 parts of plasticizer, 40–65 parts of a solvent and 2.5–10 parts of a releasing agent. When used, this coating material is preferably controlled to have a viscosity of 250–350 cps × g.per cm$^3$ at 40°C. The film-forming resin which may be used includes ethyl cellulose, cellulose acetate butyrate, a copolymer of methyl and ethyl methacrylates, a copolymer of ethyl methacrylate and ethyl acrylate, polyvinyl chloride, polyvinyl acetal, an alkyd resin or the like. The plasticizer used herein is typically dioctyl phthalate (D.O.P.). The solvent used should be one which is suitable for the resin used, and it includes ethyl acetate, butyl carbito acetate, butyl lactate, methoxybutyl acetate, nonylphenoxypolyoxyethanol or the like. The releasing agent which may be used includes silicone rubber (Trademark: Toray Silicone PRX-305), surfactant (Trademark: Separl, produced by Chukyo Yushi Co., Ltd.), wax emulsion (Trademark: Releasing Agent No. 899-2, produced by Chukyo Yushi Co., Ltd.) or the like.

This invention will be further detailed with reference to the following examples wherein all the parts are by weight unless otherwise specified.

In Examples 1–5 there was used a printing paste comprising 90 parts of powdered silver, 10 parts of lead borosilicate glass and 35 parts of an organic binder, and in Example 6 there was used a printing paste comprising a commercially available resisting paste modified with an organic binder.

EXAMPLE 1

In this example a decalcomania composition as indicated in FIG. 1 was used.

A permeable, dense backing paper was coated on one side with dextrin in the paste form and then the whole mass was dried. An electric circuit was printed on the thus-formed layer of dextrin using said silver printing paste as the ink and a 200-mesh stainless steel-made printing screen. The printed electric circuit was covered with a cover coat having the following composition:

| | | |
|---|---|---|
| Cellulose acetate, lactate | 15 | parts |
| Plasticizer (Dioctyl phthalate) | 10 | " |
| Alkyd resin | 10 | " |
| Silicone rubber (Trademark: Toray Silicone PRX-305) | 10 | " |
| Ethyl acetate | 20 | " |
| Butylcarbitol acetate | 25 | " |

The thus-prepared decalcomania composition was immersed in water to separate the water-absorbent paper from the composition thereby obtaining a mass consisting of the cover coat having the printed circuit attached to the under side thereof. The mass was slid off or transferred to an alumina substrate, dried and then freed of the cover coat by peeling. The printed circuit attached to the alumina substrate was fired or baked at a temperature of about 760°C for about 8 minutes to obtain a baked, printed circuit securely bonded to the substrate, which circuit was entirely not frizzly and highly accurate.

EXAMPLE 2

In this Example there was used such a decalcomania composition as shown in FIG. 2.

A permeable backing paper was coated on one side with a binder in the form of a layer and then further coated on the binder layer with a cover coat having the following composition:

| | | |
|---|---|---|
| Copolymer of ethyl methacrylate and ethyl acrylate | 40 | parts |
| Plasticizer (D.O.P.) | 15 | " |
| Butyl lactate | 42.5 | " |
| Surfactant (Trademark: Sepaal 441, produced by Chukyo Yushi Co., Ltd.) | 2.5 | " |

The same printing as in 1 1 was done on said cover coat formed on the binder-coated paper. This printing was of course a reversal type one.

The thus-prepared decalcomania composition was immersed in water to separate the backing paper therefrom thereby obtaining a mass consisting of the cover coat with the printed pattern attached thereto. This mass was applied to a forsterite substrate with the printed pattern facing thereto and was, after dried, freed of the cover coat by peeling. The printed pattern attached substrate was baked at approximately 760°C thereby obtaining therefrom a printed substrate which was as satisfactory as that obtained with a flat substrate although a non-flat substrate was used as the substrate in this Example.

EXAMPLE 3

In this Example there was used such a decalcomania composition as illustrated in FIG. 3.

The same permeable backing paper as used in Example 1 was coated on one side with dextrin to form a layer thereof on which an electric circuit was printed. The printed electric circuit was coated with a wax emulsion (Trademark: Releasing Agent No. 899-2, produced by Chukyo Yushi Co., Ltd.) and then covered with a cover coat of the following composition:

| Polyvinyl chloride | 15 | parts |
| Plasticizer (D.O.P.) | 20 | " |
| Ethyl acetate | 30 | " |
| Methoxybutyl acetate | 35 | " |

The decalcomania composition so obtained was treated in the same manner as in Example 1 before the wet-type sliding off of the cover coat-covered decalcomania onto an alumina substrate. After dried, the cover coat-covered decalcomania was freed of the cover coat by peeling and then baked at approximately 760°C to obtain a desired printed substrate.

It is to be noted that when immersed in water, the decalcomania allowed the water to infiltrate thereinto through the permeable backing paper side thereby dissolving the dextrin and consequently separating the paper from the composition without influences of the wax emulsion exerted on said separation.

EXAMPLE 4

Such a decalcomania composition as shown in FIG. 4 was used in this Example.

The same permeable backing paper as used in Example 1 was coated with dextrin to form a layer thereof which was then covered with the same cover coat as used in Example 2. Further, the cover coat on the paper was coated with the same wax emulsion as used in Example 3 to form a thin layer thereof on which was printed the same electric circuit as used in Example 1.

The decalcomania composition so prepared was treated to separate the paper therefrom while transferring the cover coat-covered printed pattern to the same forsterite substrate as used in Example 2. The pattern so transferred was freed of the cover coat by peeling and then baked at 850°C for 10 minutes to produce a satisfactory printed substrate.

EXAMPLE 5

In this Example there was used such a decalcomania composition as indicated in FIG. 1.

The procedure of Example 1 was followed except that the cover coat used was substituted by the one consisting singly of silicone rubber (Toray Silicone PRX-305).

In this case, there was also obtained the same satisfactory printed substrate as mentioned before.

EXAMPLE 6

In this Example there was used such a decalcomania composition as illustrated in FIG. 1.

Firstly, the procedure of Example 1 was repeated to obtain the same printed electric circuit substrate. Secondly, a decalcomania composition including a printed pattern of the resistor material (prepared by incorporating a certain organic binder into a resistor paste supplied under the trademark of Resistor Paste R-14AJN by Sumitomo Metal Co., Ltd.) was treated in the same manner as mentioned before to transfer the printed pattern of resistor material to the aforesaid printed electric circuit substrate. The whole mass thus obtained was baked or fired in the same manner as above to produce a substrate having, in combination, the printed circuit and resistor material securely bonded thereto.

The printed substrate so obtained is a very superior one as is seen from FIGS. 5 to 7.

The properties of this printed substrate is shown hereinbelow in comparison with those of the corresponding printed substrates obtained by the direct printing process.

| | Printed Substrate obtained by Direct Printing Process | Printed Substrate obtained according to this invention |
|---|---|---|
| Conductor Material Bond Strength | At least 3 Kg/mm$^2$ | At least 3 Kg/mm$^2$ |
| Resistance | 9.7 KΩ/ | 9.1 KΩ/ |
| TCR 25°C ~ 125°C | −100 PPM/°C | −95 PPM/°C |

This Example shows the case where the conductor and resistor materials were separately baked. It is possible, however, to bake both of such materials at the same time in the manufacture of printed substrates according to this invention.

While this invention has so far been explained with respect to the printed substrates wherein the printed pattern is made of electrical conductor and/or resistor material, it is also applicable to the transfer of a decalcomania made of powdered gold-containing paste or to the transfer of any decalcomania to an insulating glass.

What is claimed is:

1. A process for manufacturing a printed substrate comprising the steps of:
   providing a decalcomania composition consisting of a permeable backing paper, a water-soluble binder coated thereon, a printed electric circuit pattern made of a conductor material or resistor material formed on the binder, and a removable cover coat formed on the printed pattern,
   the removable cover coat consisting essentially of a member selected from the group of (1) silicone rubber, (2) a plastic film containing silicon rubber and (3) a film-forming coating material containing silicon rubber,
   immersing said decalcomania composition in water to separate the paper from said printed conductor or resistor material-made pattern attached to the cover coat, applying said printed pattern which is attached to the cover coat directly onto a flat or non-flat substrate substantially without any material between said printed pattern and said substrate, said substrate being of low porosity selected from the group consisting of alumina or fosterite, peeling said cover coat off said printed pattern applied to the substrate, and baking the printed pattern-applied substrate to obtain a conductor or resistor material pattern printed substrate, whereby the conductor or resistor pattern is baked substantially free of any material thereon which would have a deleterious effect on the performance of the resulting printed electric circuit.

2. A process according to claim 1, wherein the plastic film or film-forming coating material contains silicone rubber in amounts by weight of from 0.5 to 15%.

3. A process according to claim 1 wherein said pattern is made of a conductor material, and further repeating said steps using a pattern of a resistor material to thereby apply the resistor pattern material to the conductor pattern material to thereby obtain an electric circuit printed substrate.

4. A process according to claim 3 wherein the baking of the conductor and resistor material patterns is effected at the same time after they have been applied to the substrate.

5. A process for manufacturing an electric circuit printed substrate comprising the steps of:

providing a decalcomania composition consisting of a permeable backing paper, a water-soluble binder coated thereon, a removable cover coat formed on the water-soluble binder and a printed electric circuit pattern made of a conductor material or a resistor material and formed on the removable cover coat, the removable cover coat consisting essentially of a member selected from the group of (1) silicone rubber, (2) a plastic film containing silicone rubber and (3) a film-forming coating material containing silicone rubber, immersing said decalcomania composition in water to separate the paper from said cover coat to which said printed, conductor or resistor material-made pattern is attached, applying said printed pattern which is attached to said cover coat directly onto a flat or non-flat substrate substantially without any material between said printed pattern and said substrate, said substrate being of low porosity selected from the group consisting of alumina or fosterite, peeling said cover coat off said printed pattern applied to the substrate, and baking the printed pattern-applied substrate to obtain a conductor or resistor material pattern printed substrate, whereby the conductor or resistor pattern is baked substantially free of any material thereon which would have a deleterious effect on the performance of the resulting printed electric circuit.

6. A process according to claim 2 wherein the plastic film or film-forming coating material contains silicone rubber in amounts by weight of from 0.5 to 15%.

7. A process according to claim 5 wherein said pattern is made of a conductor material, and further repeating said steps using a pattern of a resistor material to thereby apply the resistor pattern material to the conductor pattern material to thereby obtain an electric circuit printed substrate.

8. A process according to claim 7 wherein the baking of the conductor and resistor material patterns is effected at the same time after they have been applied to the substrate.

* * * * *